US012666632B2

(12) United States Patent
Tsai et al.

(10) Patent No.: US 12,666,632 B2
(45) Date of Patent: Jun. 23, 2026

(54) TREATMENT OF ELECTRODES OF MIM CAPACITORS

(71) Applicant: Taiwan Semiconductor Manufacturing Co., Ltd., Hsinchu (TW)

(72) Inventors: Shin-Hung Tsai, Hsinchu (TW); Chun-Hsiu Chiang, Taipei City (TW); Cheng-Hao Hou, Hsinchu (TW); Da-Yuan Lee, Jhubei City (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 569 days.

(21) Appl. No.: 18/184,119

(22) Filed: Mar. 15, 2023

(65) Prior Publication Data

US 2024/0313041 A1     Sep. 19, 2024

(51) Int. Cl.
| | |
|---|---|
| *H10D 1/68* | (2025.01) |
| *H01G 4/008* | (2006.01) |
| *H10W 20/00* | (2026.01) |
| *H10W 20/40* | (2026.01) |
| *H10W 20/42* | (2026.01) |

(52) U.S. Cl.
CPC ............. *H10D 1/692* (2025.01); *H01G 4/008* (2013.01); *H10W 20/075* (2026.01); *H10W 20/096* (2026.01); *H10W 20/42* (2026.01); *H10W 20/496* (2026.01)

(58) Field of Classification Search
CPC ............. H01L 21/768; H01L 21/76826; H01L 21/76832; H01L 21/76897; H01L 23/522; H01L 23/5223; H01L 23/5226; H10D 1/68; H10D 1/688; H10D 1/692; H10D 1/696; H01G 4/008; H10W 20/00; H10W 20/069; H10W 20/075; H10W 20/096; H10W 20/40; H10W 20/42; H10W 20/496
See application file for complete search history.

(56) References Cited

U.S. PATENT DOCUMENTS

| | | | | |
|---|---|---|---|---|
| 2010/0330269 A1* | 12/2010 | Chen | ................. | C23C 16/45531 |
| | | | | 427/123 |
| 2012/0309163 A1* | 12/2012 | Kiyomura | ........... | H01L 21/0228 |
| | | | | 427/79 |
| 2016/0099303 A1* | 4/2016 | Phatak | ................... | H10B 12/00 |
| | | | | 257/532 |

(Continued)

FOREIGN PATENT DOCUMENTS

WO     2022102273 A1     5/2022

*Primary Examiner* — Brook Kebede
(74) *Attorney, Agent, or Firm* — Slater Matsil, LLP

(57) ABSTRACT

A method includes forming a first electrode, and depositing a dielectric layer over the first electrode. The dielectric layer has a first dielectric constant and a first thickness. A dielectric capping layer is deposited over the dielectric layer. The dielectric capping layer has a second dielectric constant higher than the first dielectric constant, and a second thickness smaller than the first thickness. The method further includes forming a second electrode over the dielectric capping layer, forming a first contact plug electrically connecting to the first electrode, and forming a second contact plug electrically connecting to the second electrode.

20 Claims, 17 Drawing Sheets

(56) References Cited

U.S. PATENT DOCUMENTS

| | | | |
|---|---|---|---|
| 2018/0138263 A1* | 5/2018 | Lin | H10D 1/696 |
| 2019/0138263 A1* | 5/2019 | Kong | G10H 1/361 |
| 2022/0293851 A1 | 9/2022 | Hsu et al. | |
| 2023/0261012 A1 | 8/2023 | Koyanagi | |

* cited by examiner

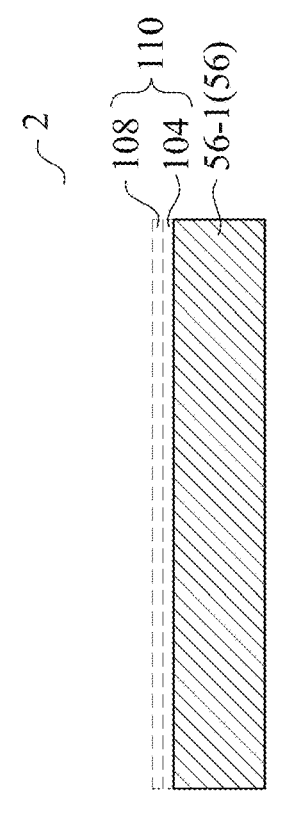
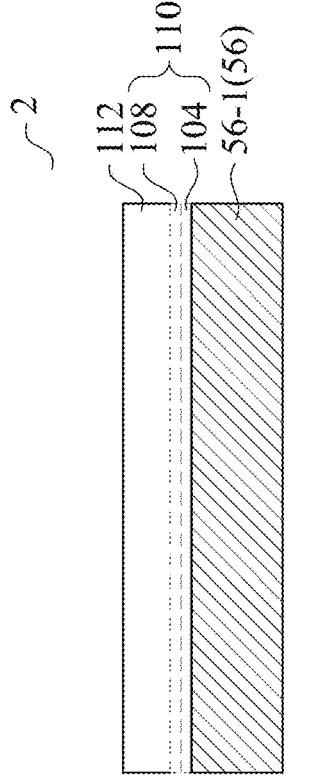
FIG. 17
FIG. 18
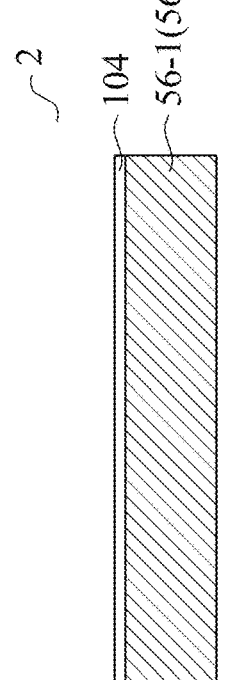
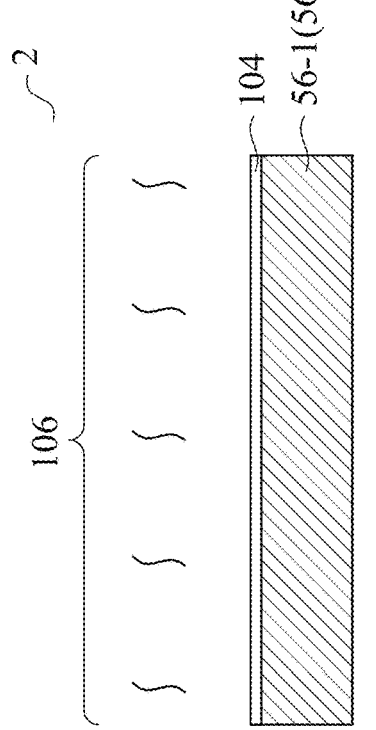
FIG. 15
FIG. 16

TREATMENT OF ELECTRODES OF MIM CAPACITORS

BACKGROUND

Metal-Insulator-Metal (MIM) capacitors have been widely used in functional circuits such as mixed signal circuits, analog circuits, Radio Frequency (RF) circuits, Dynamic Random-Access Memories (DRAMs), embedded DRAMs, and logic operation circuits. For example, in system-on-chip applications, different capacitors for different functional circuits may be used to serve different purposes. In mixed-signal circuits, capacitors may also be used as decoupling capacitors and high-frequency noise filters. For DRAM and embedded DRAM circuits, capacitors may be used for memory storage, while for RF circuits, capacitors may be used in oscillators and phase-shift networks for coupling and/or bypassing purposes. For microprocessors, capacitors may be used for decoupling.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 15 through 20 illustrate the magnified cross-sectional views of intermediate stages in the formation of a capacitor insulator and the respective overlying and underlying capacitor electrodes in accordance with some embodiments.

DETAILED DESCRIPTION

Figure 1:
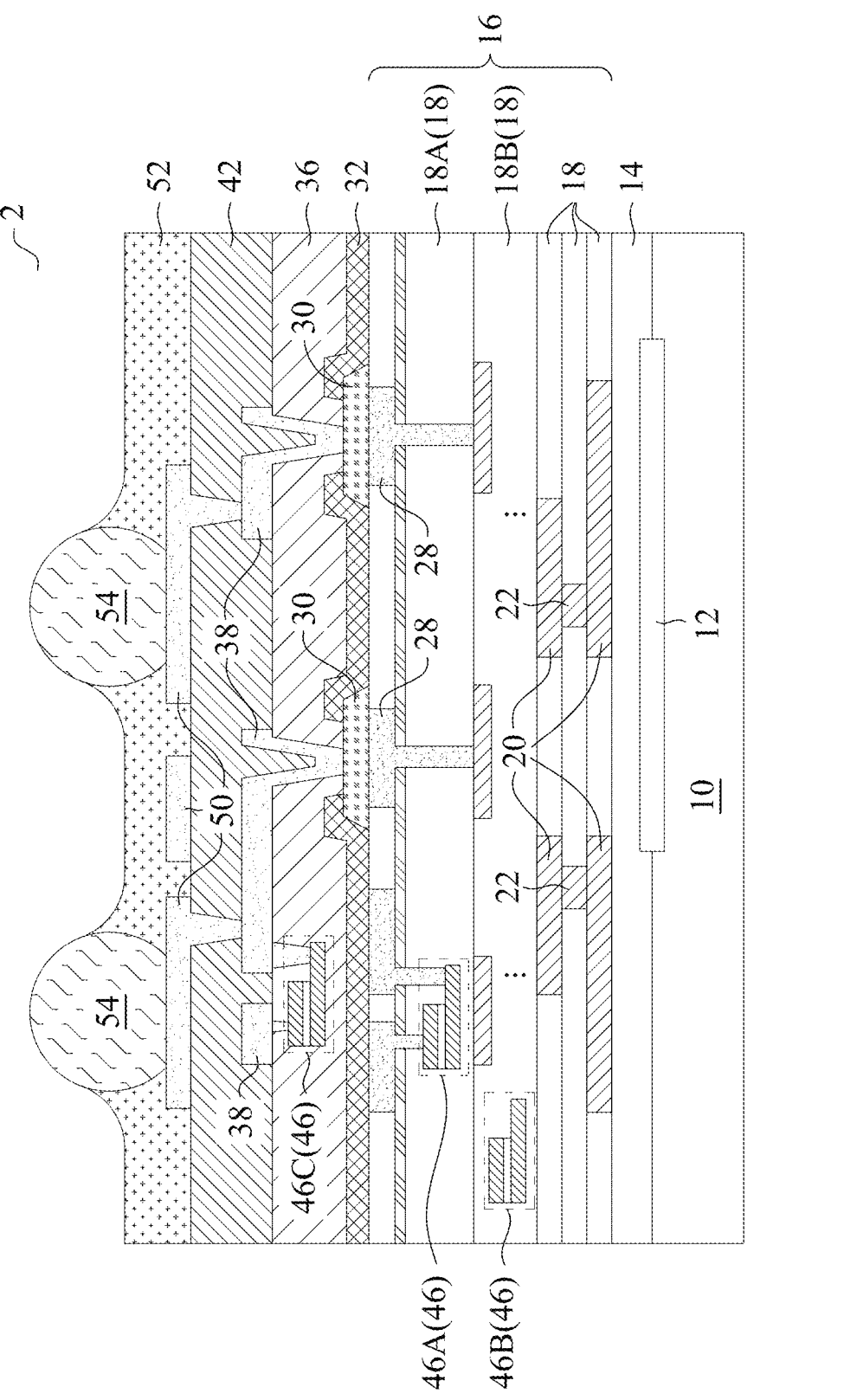
FIG. 1 illustrates a cross-sectional view of a package component including one or a plurality of Metal-Insulator-Metal (MIM) capacitors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A capacitor and the method of forming the same are provided. In accordance with some embodiments, the formation of a capacitor insulator in a Metal-Insulator-Metal (MIM) capacitor includes depositing a first electrode, performing a treatment process using nitrogen plasma on the first electrode, depositing a major insulator layer of the capacitor insulator, and depositing a high-k dielectric layer over the major insulator layer, wherein the high-k dielectric layer has a higher k value than the major insulator layer. A second electrode is then deposited over the high-k dielectric layer. By forming the high-k dielectric layer over the major part of a capacitor insulator, the capacitor is more symmetric. The performance of the MIM capacitor is thus improved.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIG. 1 illustrates a cross-sectional view of package component 2 including a capacitor(s) therein. Package component 2 may be a device wafer, an interposer wafer, a package (such as an Integrated Fan-Out (InFO) package), or the like. In the subsequently illustrated embodiments, a device wafer is used as an example, and capacitors may be formed in the back-end redistribution structure of the device wafer, while the capacitor(s) may be formed in other structures. An example structure of wafer 2 is discussed herein to show where a capacitor(s) may be formed. The capacitor in accordance with the embodiments of the present disclosure, however, are not limited to the illustrative structure of package component 2.

Referring to FIG. 1, wafer 2 includes semiconductor substrate 10. In accordance with some embodiments, semiconductor substrate 10 is a bulk silicon substrate or a silicon-on-insulator substrate. In accordance with alternative embodiments of the present disclosure, other semiconductor materials that include group III, group IV, and/or group V elements may also be used, which may include silicon germanium, carbon-doped silicon, and/or III-V compound semiconductor materials. Integrated circuit devices 12, which may include active devices such as transistors are formed at a surface of semiconductor substrate 10.

Wafer 2 may further include Inter-Layer Dielectric (ILD) 14 and interconnect structure 16 over semiconductor substrate 10. Interconnect structure 16 includes metal lines 20 and vias 22, which are formed in dielectric layers 18. The metal lines at a same level are collectively referred to as being a metal layer hereinafter. Accordingly, interconnect structure 16 may include a plurality of metal layers that are interconnected through vias 22. Metal lines 20 and vias 22 may be formed of copper or copper alloys, although they can also be formed of other metals. In accordance with some embodiments, dielectric layers 18 are formed of low-k dielectric materials. The dielectric constants (k values) of the low-k dielectric materials may be lower than about 3.5, or lower than about 3.0, for example.

Metal pads 30 are formed over interconnect structure 16, and may be electrically coupled to integrated circuit devices 12 through metal lines 20 and vias 22. Metal pads 30 may be aluminum pads or aluminum-copper pads, and hence are alternatively referred to as aluminum pads 30 hereinafter, while other metallic materials may be used. In accordance with some embodiments, metal pads 30 are in physical contact with the underlying metal vias or metal lines (or pads) in the top metal layer in interconnect structure 16. For example, as shown in FIG. 1, metal pads 30 have bottom surfaces in contact with the top surfaces of metal pads 28.

As also shown in FIG. 1, passivation layer 32 is formed over interconnect structure 16. Passivation layer 32 has a k value equal to or greater than 3.8, and is formed using a non-low-k dielectric material(s). In accordance with some embodiments, passivation layer 32 is a composite layer including a silicon oxide layer (not shown), and a silicon nitride layer (not shown) over the silicon oxide layer. Passivation layer 32 may also be formed of other non-porous dielectric materials such as Un-doped Silicate Glass (USG), silicon oxynitride, and/or the like.

Passivation layer 32 is patterned, so that some portions of passivation layer 32 cover the edge portions of aluminum pads 30, and some middle portions of aluminum pads 30 are exposed through the openings in passivation layer 32. Passivation layer 32 and metal pads 30 may have some portions level with each other in accordance with some embodiments.

Polymer layer 36 is formed over metal pads 30 and passivation layer 32. In accordance with some embodiments, polymer layer 36 is formed of polybenzoxazole (PBO). In accordance with alternative embodiments, polymer layer 36 is formed of other polymers such as polyimide, benzocyclobutene (BCB), or the like. The material of polymer layer 36 may be photo sensitive, although non-photo-sensitive materials may also be used.

Post-Passivation Interconnect (PPI) 38 may formed, which includes line portions over polymer layer 36, and via portions extending into polymer layer 36. PPI 38 is thus electrically connected to metal pads 30. PPI 38 may be formed of copper or a copper alloy, for example.

Polymer layer 42 is formed over polymer layer 36 and PPI 38. In accordance with some embodiments, polymer layer 42 is formed of a polymer such as PBO, polyimide, BCB, or the like. The material of polymer layer 42 may be photo sensitive, although non-photo-sensitive materials may also be used. Polymer layers 36 and 42 may be formed of a same type of polymer, or may be formed of different types of polymers.

PPI 50 is formed over polymer layer 42, and is electrically connected to PPI 38 and integrated circuit 12. PPI 50 includes a plurality of redistribution lines. In accordance with some embodiments, PPI 50 is in dielectric layer 52, which encircles PPI 50, and contacts the top surface of polymer layer 42. Dielectric layer 52 may be a molding compound, a polymer layer, or the like. The top surfaces and the sidewalls of PPI 50 may also be in physical contact with dielectric layer 52.

In accordance with some embodiments, electrical connectors 54 are formed to electrically connect to PPI 50. Electrical connectors 54 may include metal regions, which may include solder balls placed on PPI 50. Electrical connectors 54 may also include metal pillars. In the embodiments in which electrical connectors 54 include solder, the solder may be placed or plated, and the plating of solder may be similar to the formation of PPI 38. Electrical connectors 54 have upper portions over the top surface of dielectric layer 52, and lower portions embedded in dielectric layer 52. After the formation of electrical connectors 54, wafer 2 may be sawed into individual package components (which may be device dies), each including integrated circuit device 12 and one capacitor 46 or a plurality of capacitors 46.

In accordance with some embodiments, one or more capacitor 46 (represented by 46A, 46B, and 46C) are formed in one of dielectric layers 18, or in polymer layer 36 or 42. For example, capacitor 46 may be in the top dielectric layer immediately underlying the passivation layer 32, as represented by capacitor 46A. Capacitor 46 may also be in a dielectric layer under the top dielectric layer, as represented by capacitor 46B. Capacitor 46 may also be in a polymer layer such as polymer layer 36 or 42, as represented by capacitor 46C. In accordance with some embodiments, capacitor 46 is a decoupling capacitor, with the top electrode and the bottom electrode of capacitor 46 being electrically coupled to power supply lines such as VDD and VSS. Accordingly, capacitor 46 is used to filter noise and/or also used as a power storage for reducing the voltage variation resulted from the current-drawn from the power source.

In accordance with alternative embodiments, the top electrode and the bottom electrode of capacitor 46 are connected to signal lines, and capacitor 46 is used to filter noise. The top electrode and the bottom electrode of capacitor 46 are connected to contact plugs, as will be provided in the subsequently discussed process flow. In accordance with alternative embodiments, capacitor 46 is used for other purposes such as in Dynamic Random-Access Memory (DRAM) cells.

Figure 22:
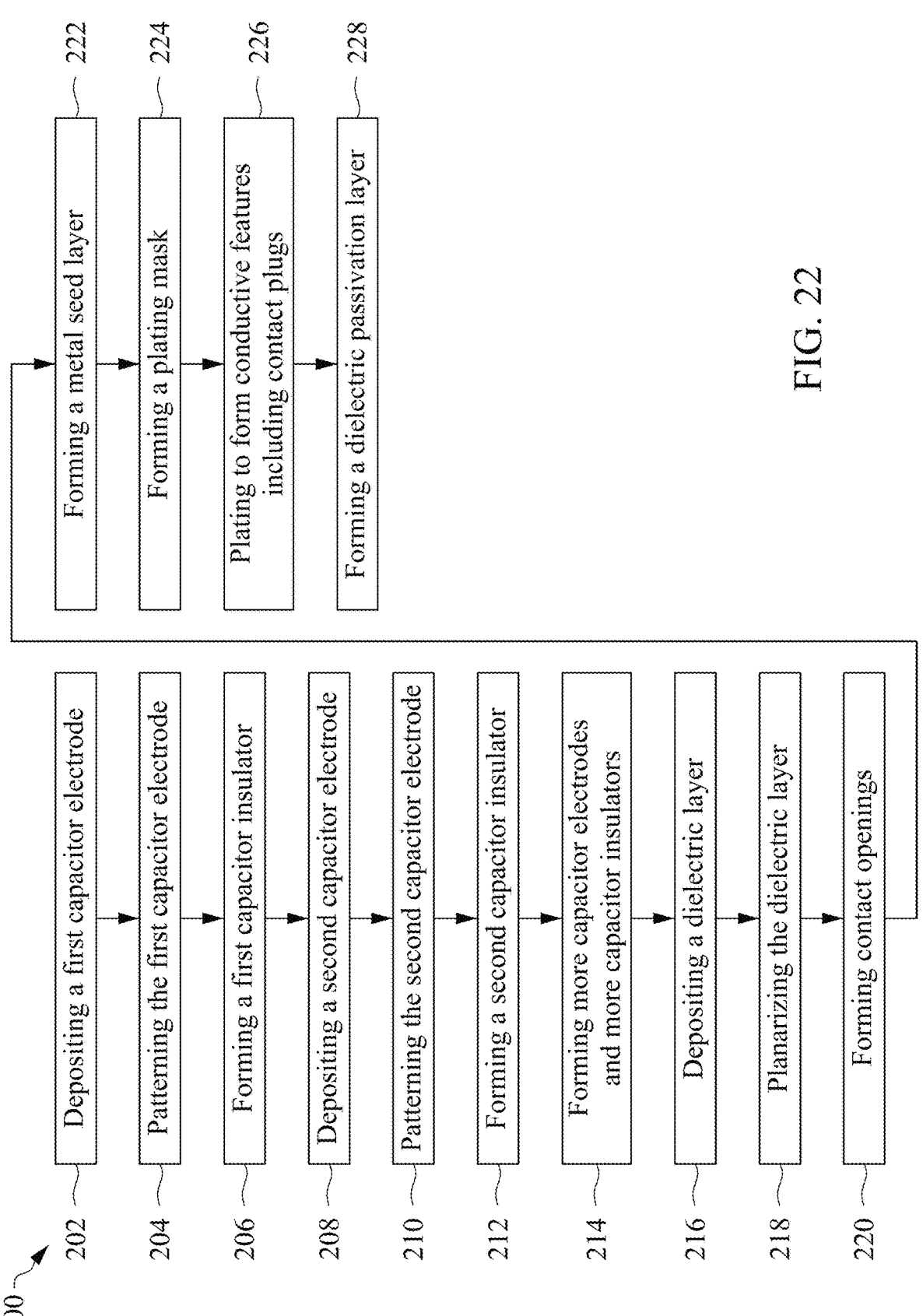
FIG. 22 illustrates a process flow for forming a MIM capacitor in accordance with some embodiments.

FIGS. 2 through 14 illustrate the cross-sectional views of intermediate stages in the formation of capacitor 46 (FIG. 14) in wafer 2 in accordance with some embodiments. The processes shown in FIG. 2 through 14 are also illustrated schematically in the process flow 200 as shown in FIG. 22. The process shown in FIGS. 2 through 14 may represent the process for forming capacitor 46A in dielectric layer 18A as shown in FIG. 1. The concept of the example embodiments may be used for forming capacitors in various layers, such as what are represented by capacitors 46B and 46C in FIG. 1.

Figure 2:
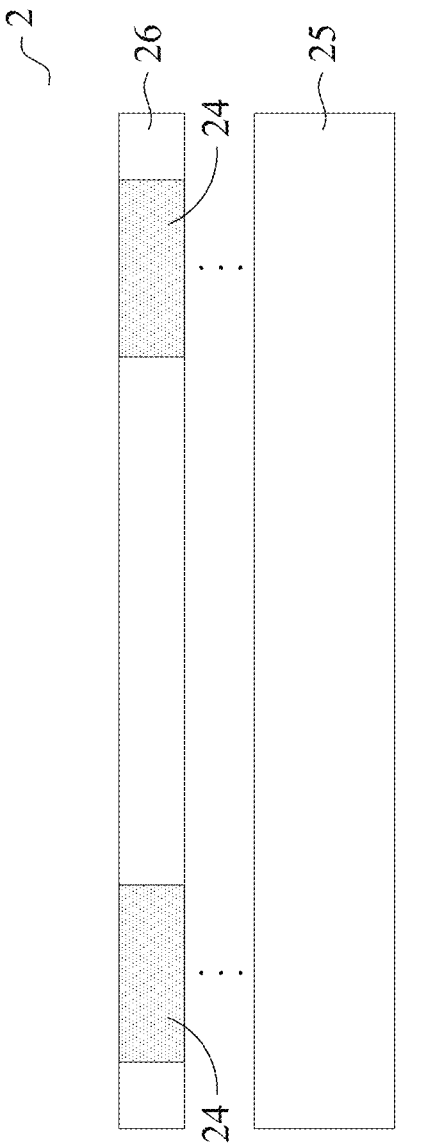
FIGS. 2 through 14 illustrate the cross-sectional views of intermediate stages in the formation of a MIM capacitor in accordance with some embodiments.

Referring to FIG. 2, conductive features 24 are illustrated. The portions of wafer 2 underlying conductive features 24 are represented as features 25. The details of features 25 are not illustrated, and may be found referring to FIG. 1. In accordance with some embodiments in which capacitor 46A (FIG. 1) is to be formed, conductive features 24 are the metal lines or metal pads formed in dielectric layer 18B (FIG. 1). In accordance with alternative embodiments in which capacitor 46B (FIG. 1) is to be formed, conductive features 24 are the metal lines or metal pads underlying dielectric layer 18B. In accordance with yet other embodiments in which capacitor 46C (FIG. 1) is to be formed, conductive features 24 are metal pads 30 or some portions of PPI 38.

Figure 3:
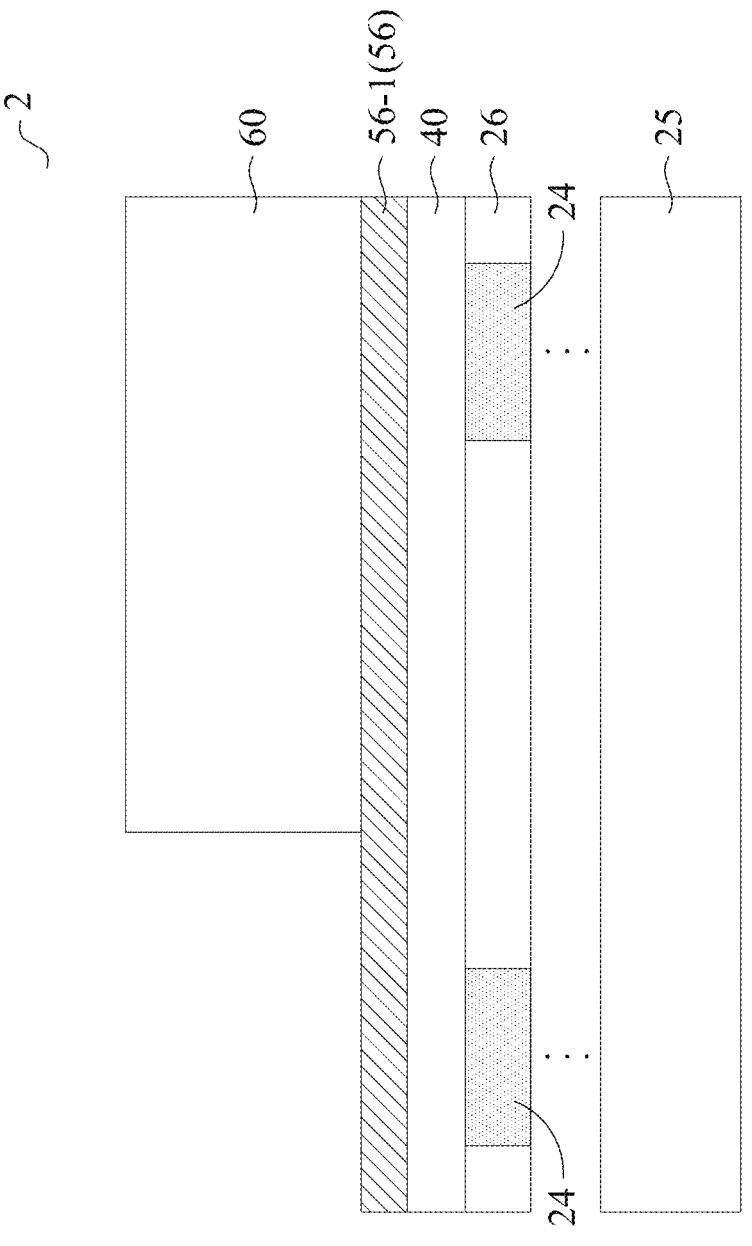

Referring to FIG. 3, dielectric layer 40 is formed over conductive features 24. Although not shown, an etch stop layer may be (or may not be) formed between conductive features 24 and dielectric layer 40. Depending on the position, dielectric layer 40 may be formed of an inorganic material such as USG, silicon carbide, silicon carbo-nitride (SiCN), silicon oxide, silicon nitride, or the like, combinations thereof, and/or multi-layers thereof. Dielectric layer 40 may be formed using Plasma Enhance Chemical Vapor Deposition (PECVD), Low-Pressure Chemical Vapor Deposition (LPCVD), Atomic Layer Deposition (ALD), or the like.

Next, bottom capacitor electrode 56-1 is deposited as a blanket layer. The respective process is illustrated as process 202 in the process flow 200 as shown in FIG. 22. Bottom capacitor electrode 56-1 is formed of a conductive material. For example, bottom capacitor electrode 56-1 may be formed of or comprise a metal nitride such as titanium nitride (TiN), tantalum nitride (TaN), or the like. The deposition process may include ALD, Chemical Vapor Deposition (CVD), PECVD, or the like.

Etching mask 60 is then formed, and is patterned. In accordance with some embodiments, etching mask 60 comprises a photoresist. Next, an etching process is performed to pattern bottom capacitor electrode 56-1. The respective process is illustrated as process 204 in the process flow 200 as shown in FIG. 22. In accordance with some embodiments, the etching is performed through a dry etching process. The etching gas may include a chlorine-based gas such as $TiCl_4$, $TaCl_4$, $WCl_4$, chlorine ($Cl_2$), and/or the like. The etching gas may also include a fluorine-containing gas such as $CHF_3$, $CF_4$, or the like, or the combination of the aforementioned gases. Oxygen ($O_2$) may also be included in the etching gas.

Figures 4, 5:
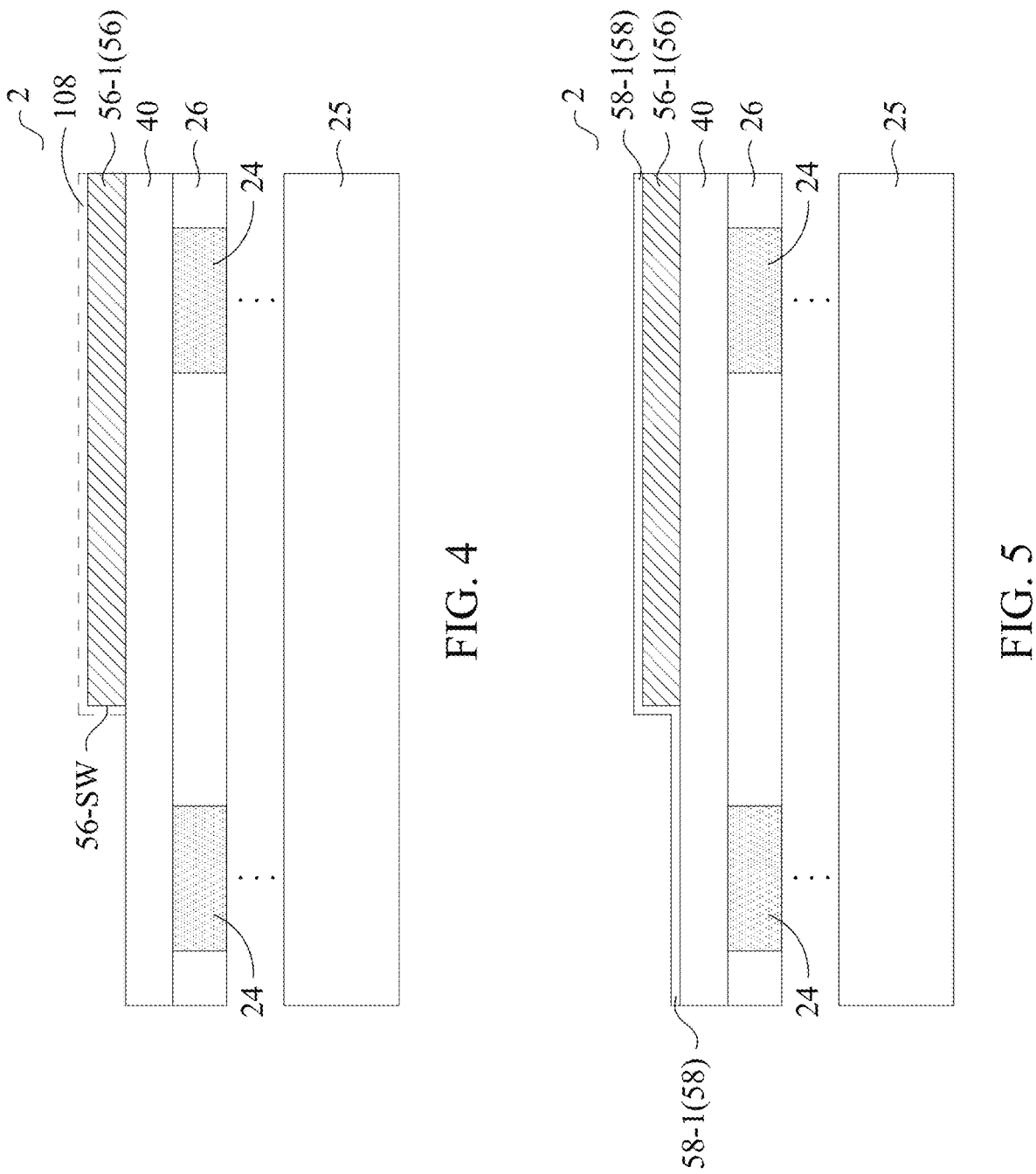

In accordance with alternative embodiments, the etching is performed through a wet etching process. The etching chemical may include the mixture of $NH_4OH$ (ammonia water) and $H_2O_2$, the mixture of $H_2O_2$ and $H_2O$, and/or the like. Etching mask 60 is then removed, and the resulting structure is shown in FIG. 4. A cleaning process, which may be a wet process, may be performed to remove by-products. High-k dielectric layer 108 may be, or may not be, formed, as will be discussed in subsequent paragraphs.

Figure 23:
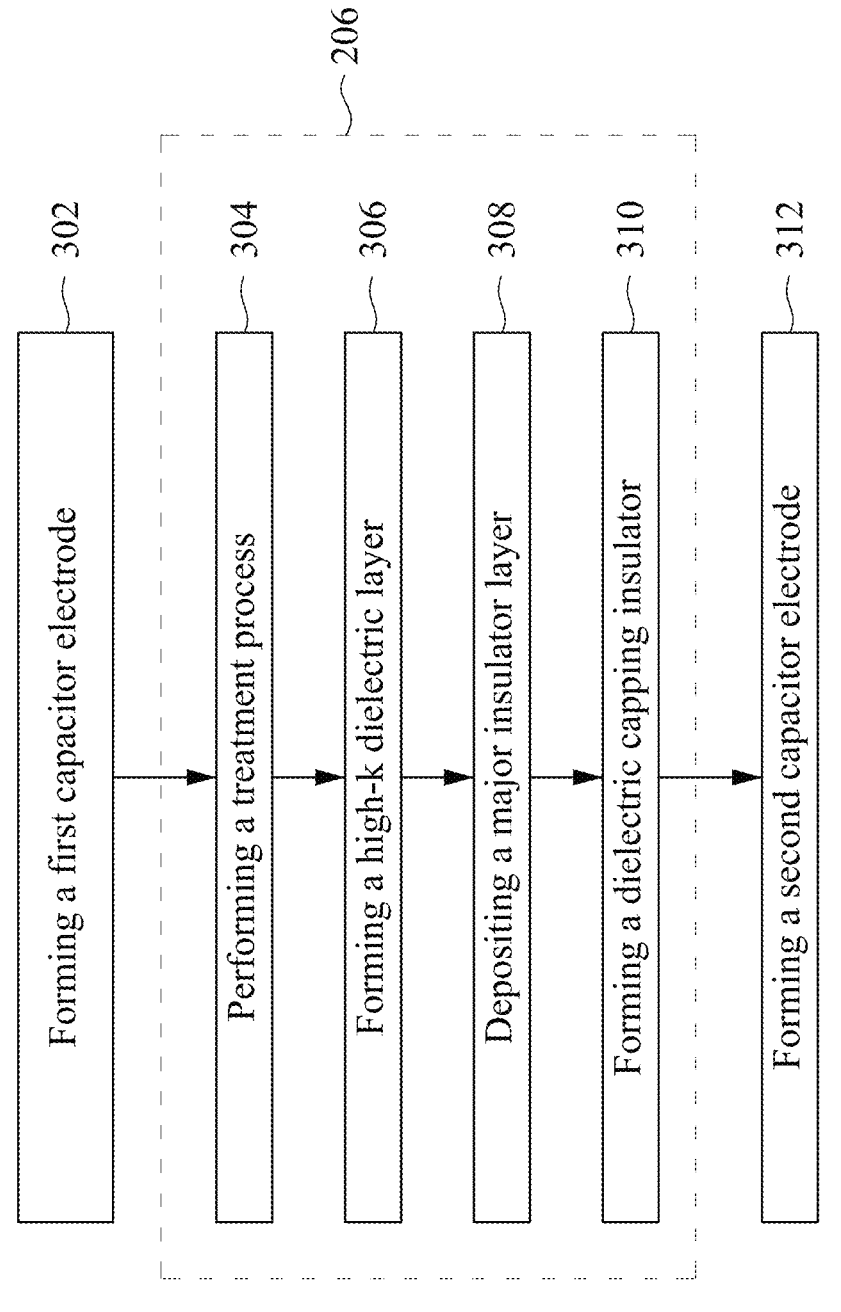
FIG. 23 illustrates a process flow for forming a capacitor insulator and the respective overlying and underlying capacitor electrodes in accordance with some embodiments.

FIG. 5 illustrates the formation of capacitor insulator 58-1. The respective process is illustrated as process 206 in the process flow 200 as shown in FIG. 22. The detailed formation processes, structures, and materials of capacitor insulator 58-1 are discussed in detail referring to the processes as shown in FIGS. 15 through 20. The detailed process flow of process 206 is also shown in FIG. 23.

In accordance with some embodiments, capacitor insulator 58-1 is a composite layer including a plurality of sublayers, which may include a first dielectric layer and a second dielectric layer over the first dielectric layer. The first dielectric layer may be a nitrogen-doped titanium oxide (TiO) layer. The second dielectric layer may include hafnium zirconium oxide (HfZrO), zirconium oxide ($ZrO_2$), hafnium oxide ($HFO_2$), or the like. Capacitor insulator 58-1 may further include a third dielectric layer over the second dielectric layer. The third dielectric layer may comprise titanium oxide or another dielectric material. The formation process of the dielectric layers may include ALD, CVD, or the like.

Figure 6:
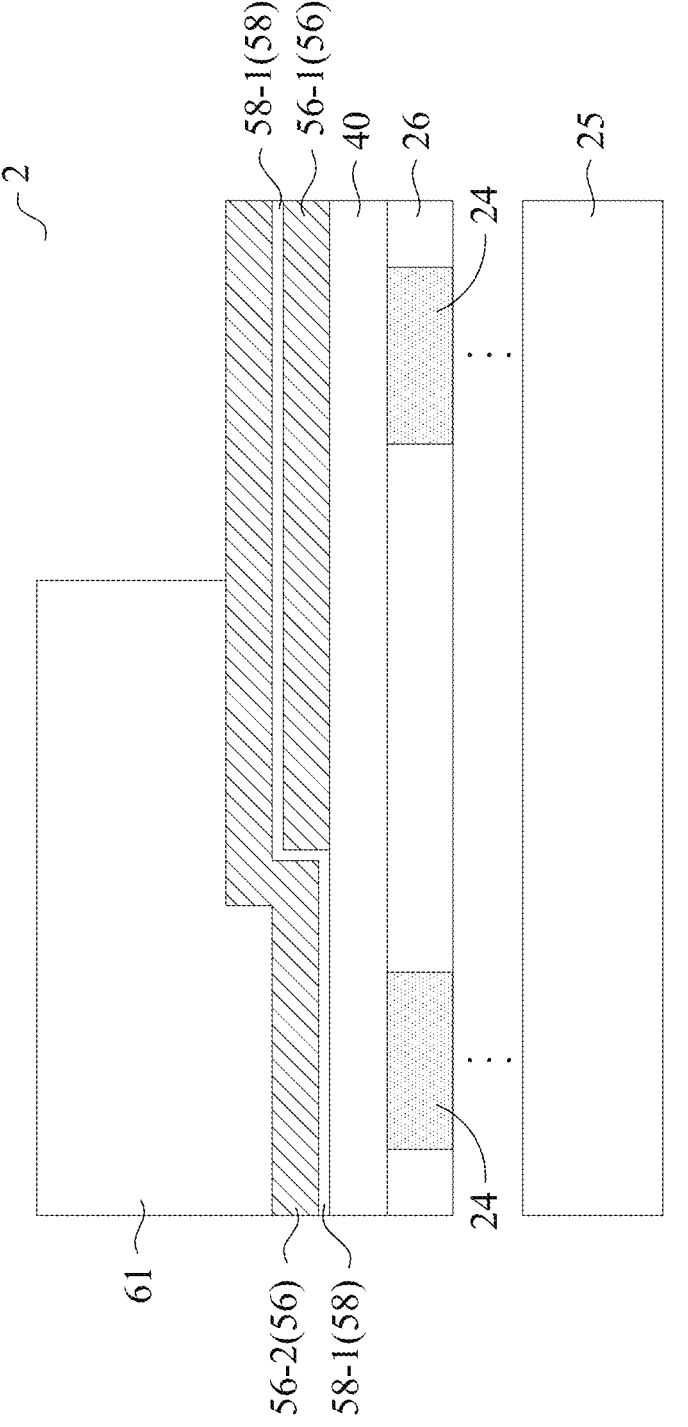

Referring to FIG. 6, capacitor electrode 56-2 is deposited as a blanket layer. The respective process is illustrated as process 208 in the process flow 200 as shown in FIG. 22. In accordance with some embodiments, capacitor electrode 56-2 is formed of or comprises the same or similar material (such as TiN or TaN) as bottom capacitor electrode 56-1. A patterned etching mask 61 is then formed, which may be a single layer formed of a photoresist, or may be a tri-layer etching mask.

Capacitor electrode 56-2 is then etched using etching mask 61 to define the patterns. The respective process is illustrated as process 210 in the process flow 200 as shown in FIG. 22. In the etching of capacitor electrode 56-2, capacitor insulator 58-1 is used as an etch stop layer. Since capacitor insulator 58-1 includes multiple sub-layers, the etching may be stopped on the top sub-layer (such as TiO layer 114 in FIG. 20) in capacitor insulator 58-1, or may be stopped on an intermediate layer (such as major insulator layer 112 in FIG. 20). Etching mask 61 is then removed. The resulting structure is shown in FIG. 7.

Figure 7:
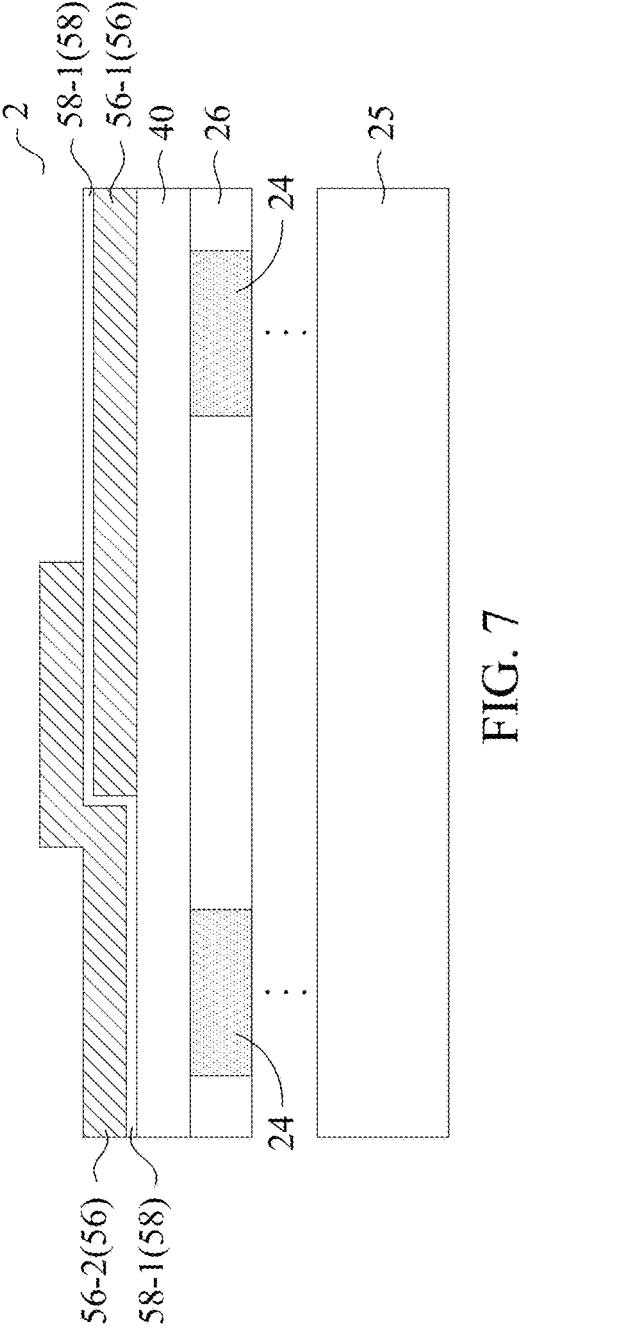
Figure 8:
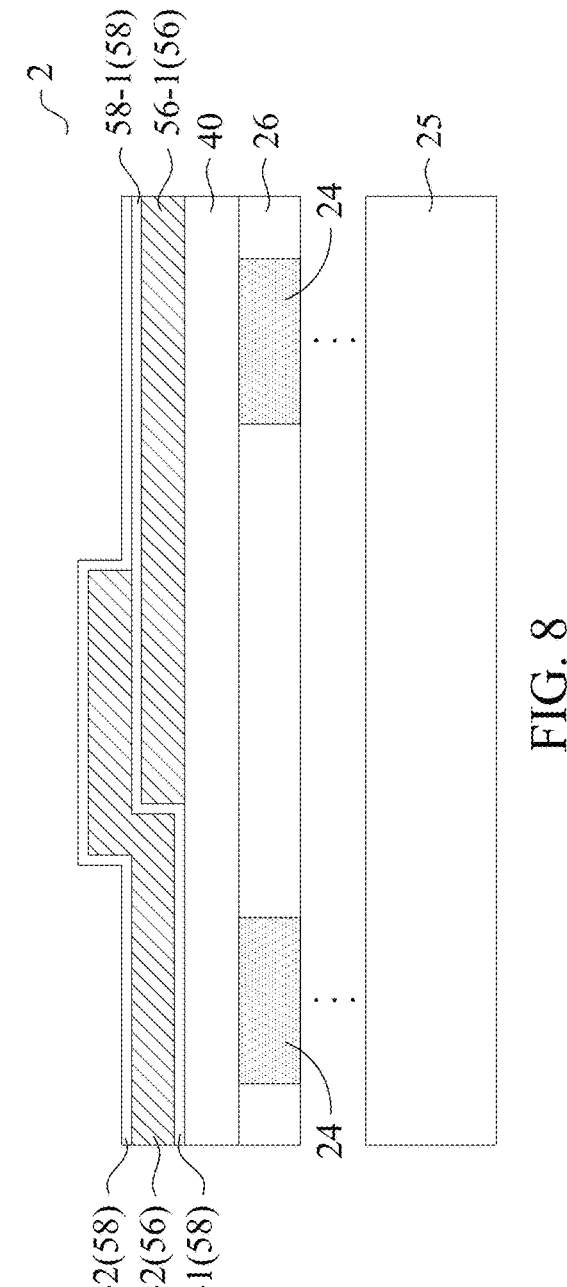
Figure 9:
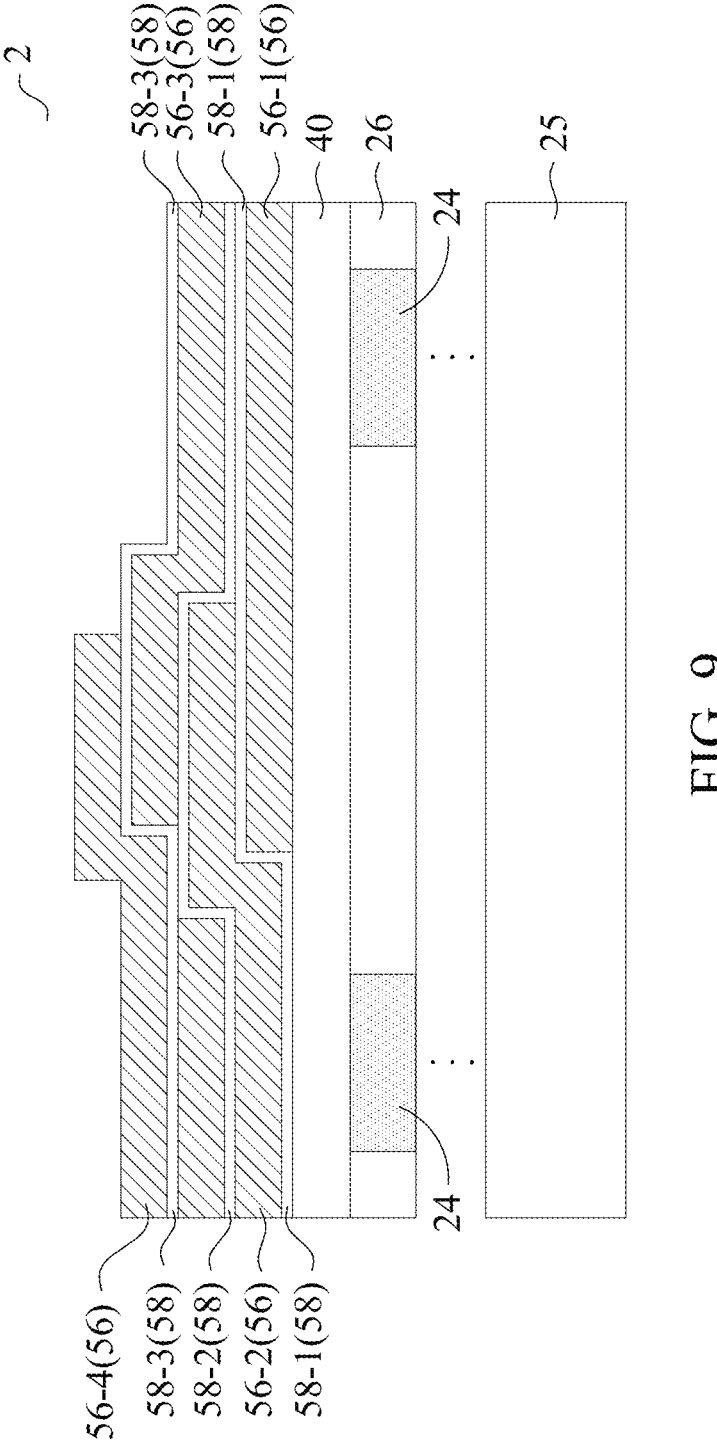

In accordance with some embodiments, more capacitor electrodes and capacitor insulators (as shown in FIGS. 8 and 9) are formed over the structure shown in FIG. 7 to increase the capacitance of the resulting capacitor. In accordance with alternative embodiments, no more capacitor electrodes and capacitor insulators are formed over capacitor electrode 56-2, and the process flow proceeds to the process shown in FIG. 10.

Referring to FIG. 8, capacitor insulator 58-2 is formed. The respective process is illustrated as process 212 in the process flow 200 as shown in FIG. 22. In accordance with some embodiments, capacitor insulator 58-2 has a multilayer structure including a plurality of sub-layers. The structure and the formation process may also be essentially the same as that of capacitor insulator 58-1, and the structure and the formation process may be found referring to FIGS. 15 through 20 and the related discussion.

FIG. 9 illustrates the formation of more capacitor electrodes (such as capacitor electrodes 56-3 and 56-4) and more capacitor insulators (such as capacitor insulator 58-3). The respective process is illustrated as process 214 in the process flow 200 as shown in FIG. 22. It is appreciated that the structure illustrated in FIG. 9 is an example, and the capacitor may include more or fewer capacitor electrodes and capacitor insulators. The formation of capacitor electrodes 56-3 and 56-4 may be the same or similar to the formation of capacitor electrode 56-1. The formation of capacitor insulator 58-3 may be the same or similar to the formation of capacitor insulator 58-1, and the materials and the formation processes may be found referring to FIGS. 15 through 20. Throughout the description, capacitor electrodes 56-1, 56-2, 56-3, and 56-4 are collectively and individually referred to as capacitor electrodes 56. Capacitor insulators 58-1, 58-2, and 58-3 are collectively and individually referred to as capacitor insulators 58.

Figure 10:
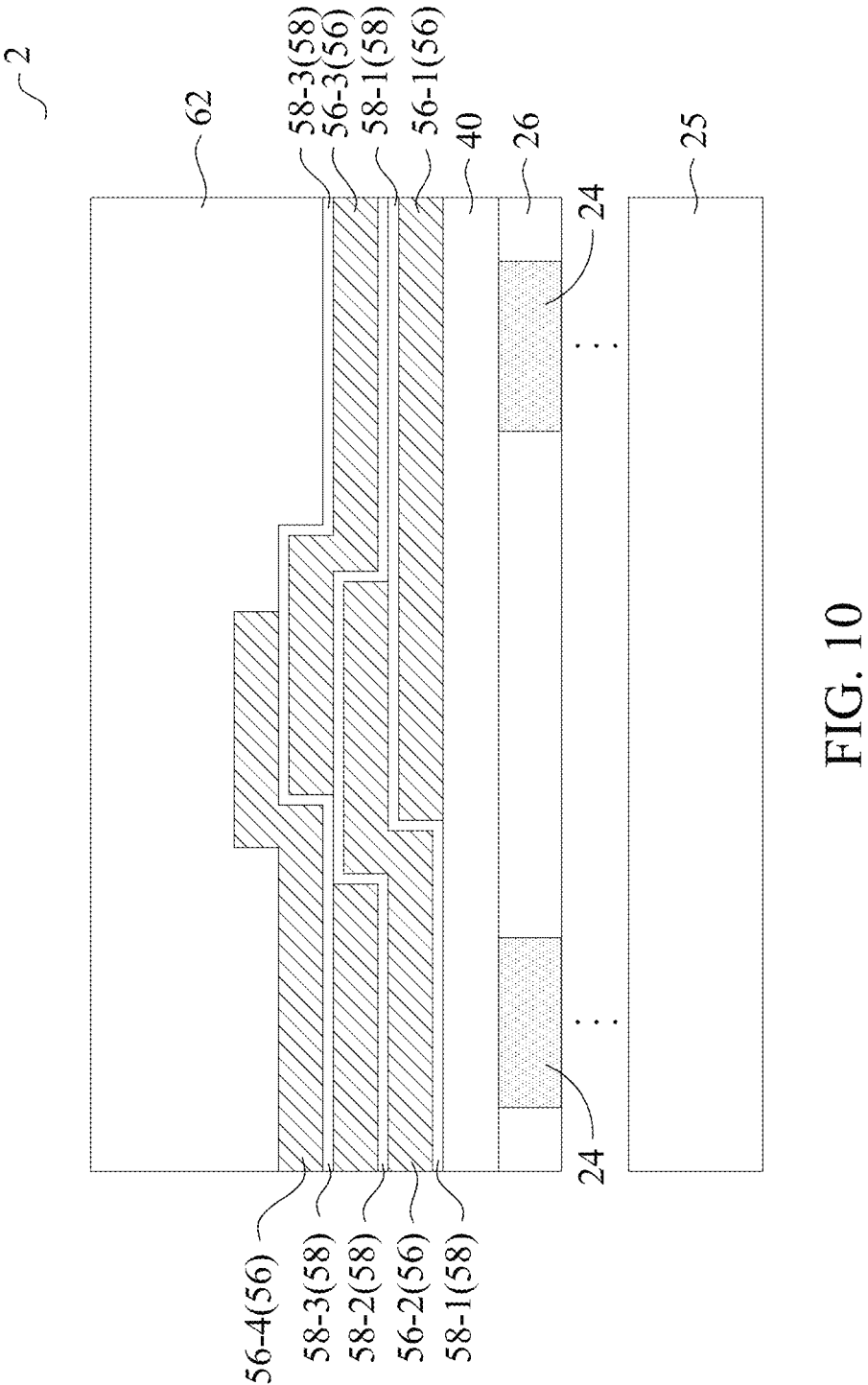

Next, as shown in FIG. 10, dielectric layer 62 is deposited. The respective process is illustrated as process 216 in the process flow 200 as shown in FIG. 22. In accordance with some embodiments, dielectric layer 62 is formed of or comprises USG, silicon nitride, silicon oxide, silicon oxynitride, silicon oxycarbide, or the like. In accordance with alternative embodiments, dielectric layer 62 may be formed of a low-k dielectric material, for example, when the resulting capacitor is one of capacitors 46A and 46B (FIG. 1). In accordance with yet alternative embodiments, dielectric layer 62 may be polymer layer 36 or 42 in the embodiments shown in FIG. 1. After the deposition of dielectric layer 62, a planarization process such as a Chemical Mechanical Polish (CMP) process or a mechanical grinding process may be performed, so that the top surface of dielectric layer 62 is planar. The respective process is illustrated as process 218 in the process flow 200 as shown in FIG. 22.

Figure 11:
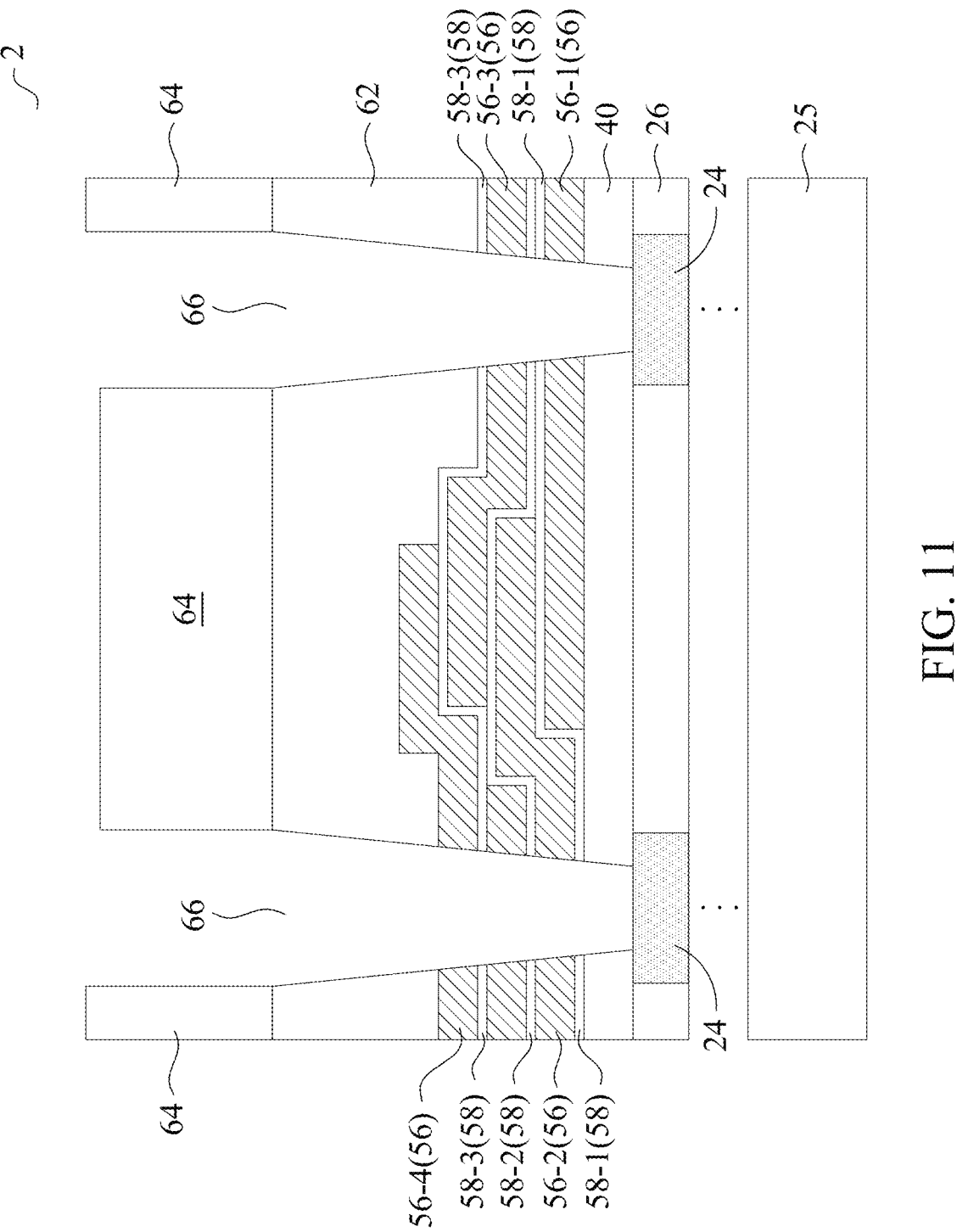

FIG. 11 illustrates a photo lithography process. Etching mask 64 is first formed. In accordance with some embodiments, etching mask 64 comprises a photoresist, and may include anti-reflective coating therein. Etching mask 64 may have a single-layer structure, a dual-layer structure, a tri-layer structure, or the like. Next, etching processes are performed to etch dielectric layer 62, capacitor electrodes 56, and capacitor insulators 58. Contact openings 66 are formed, and dielectric layer 40 is also etched-through, so that conductive features 24 are revealed to contact openings 66. The respective process is illustrated as process 220 in the process flow 200 as shown in FIG. 22.

The etching of capacitor electrodes 56-1, 56-2, 56-3, and 56-4 may use the similar etching chemicals (such as gases or chemical solutions) as what is used for patterning capacitor electrodes 56-2 and 56-2. For example, chlorine-based gas such as $TiCl_4$, $TaCl_4$, $WCl_4$, chlorine ($Cl_2$), and/or the like, fluorine-containing gas such as $CHF_3$, $CF_4$, or the like, or the combinations of these gases, may be used if dry etching processes are used. The mixture of $NH_4OH$ and $H_2O_2$, the mixture of $H_2O_2$ and $H_2O$, and/or the like may be used when wet etching processes are used.

The etching of capacitor insulators 58-1, 58-2, and 58-3 may adopt HBr, $BCl_3$, $Cl_2$, $CF_4$, $CH_4$, $C_4F_8$, $CHF_3$, $SF_6$, $O_2$, and/or the like when dry etching is used, depending on the specific materials of capacitor insulators 58-1, 58-2, and 58-3. When wet etching processes are adopted, phosphoric acid solution, HF solution, and/or the like may be used.

The etching of dielectric layer 40 may be performed through a dry etching process. The etching gas may include a fluorine-containing gas such as $CF_4$, $NF_3$, $SF_6$, $CHF_3$, or combinations thereof. Other gases such as $O_2$, $N_2$, $H_2$, Ar, NO, and the like, or combinations thereof may also be added, depending on the material of dielectric layer 40. A bias power is applied, so that the etching is anisotropic. After the etching process, conductive features 24 are exposed to contact openings 66. Etching mask 64 is then removed.

Figure 12:
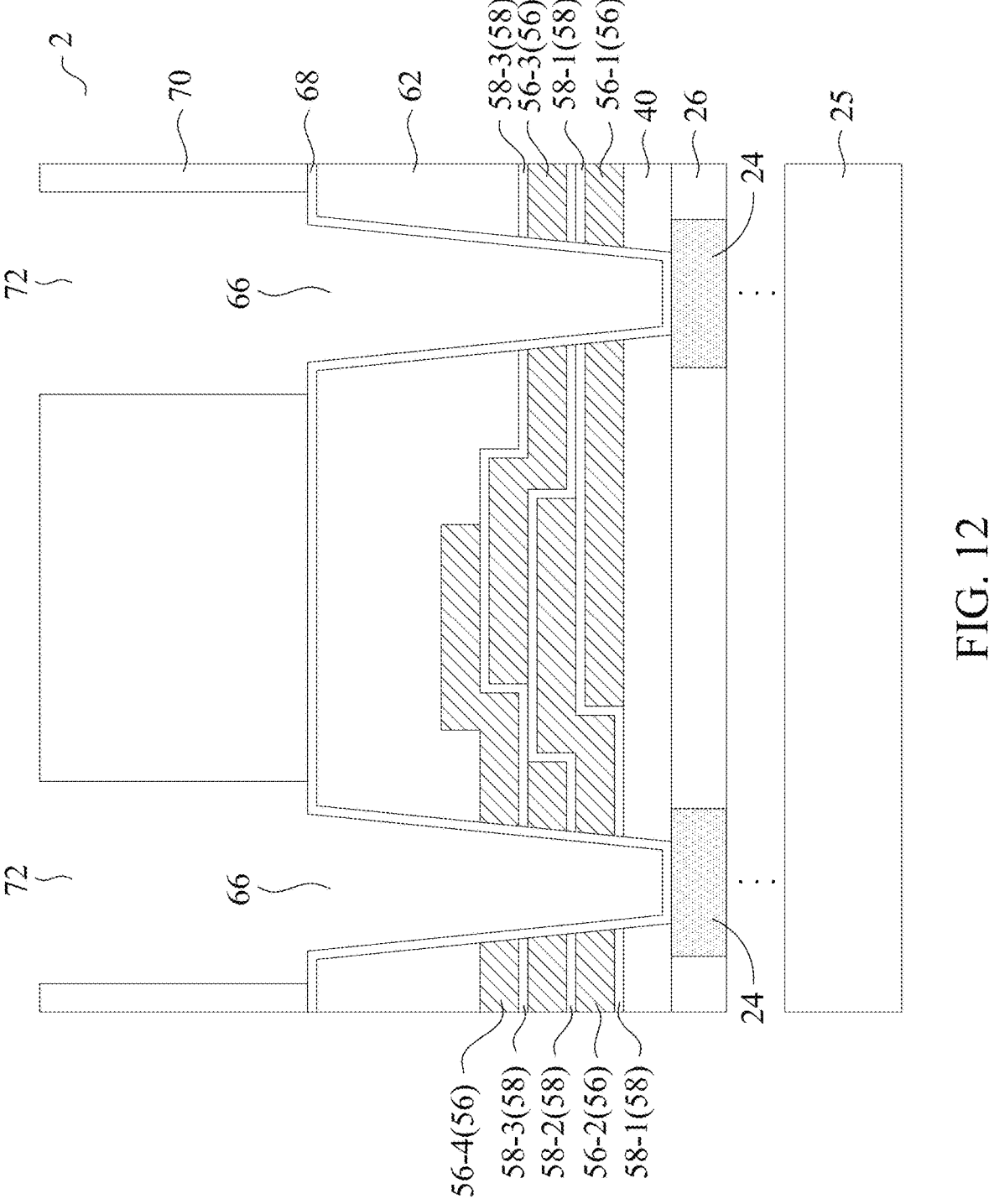

FIG. 12 illustrates the deposition of metal seed layer 68. The respective process is illustrated as process 222 in the process flow 200 as shown in FIG. 22. In accordance with some embodiments, metal seed layer 68 comprises a titanium layer and a copper layer over the titanium layer. In accordance with alternative embodiments, metal seed layer 68 comprises a copper layer in contact with dielectric layer 62. The deposition process may be performed using Physical Vapor Deposition (PVD), CVD, Metal Organic Chemical Vapor Deposition (MOCVD), or the like.

FIG. 12 further illustrates the formation of patterned plating mask 70. The respective process is illustrated as process 224 in the process flow 200 as shown in FIG. 22. In accordance with some embodiments, plating mask 70 is formed of or comprises photoresist. Openings 72 are formed in the patterned plating mask 70 to reveal metal seed layer 68.

Figure 13:
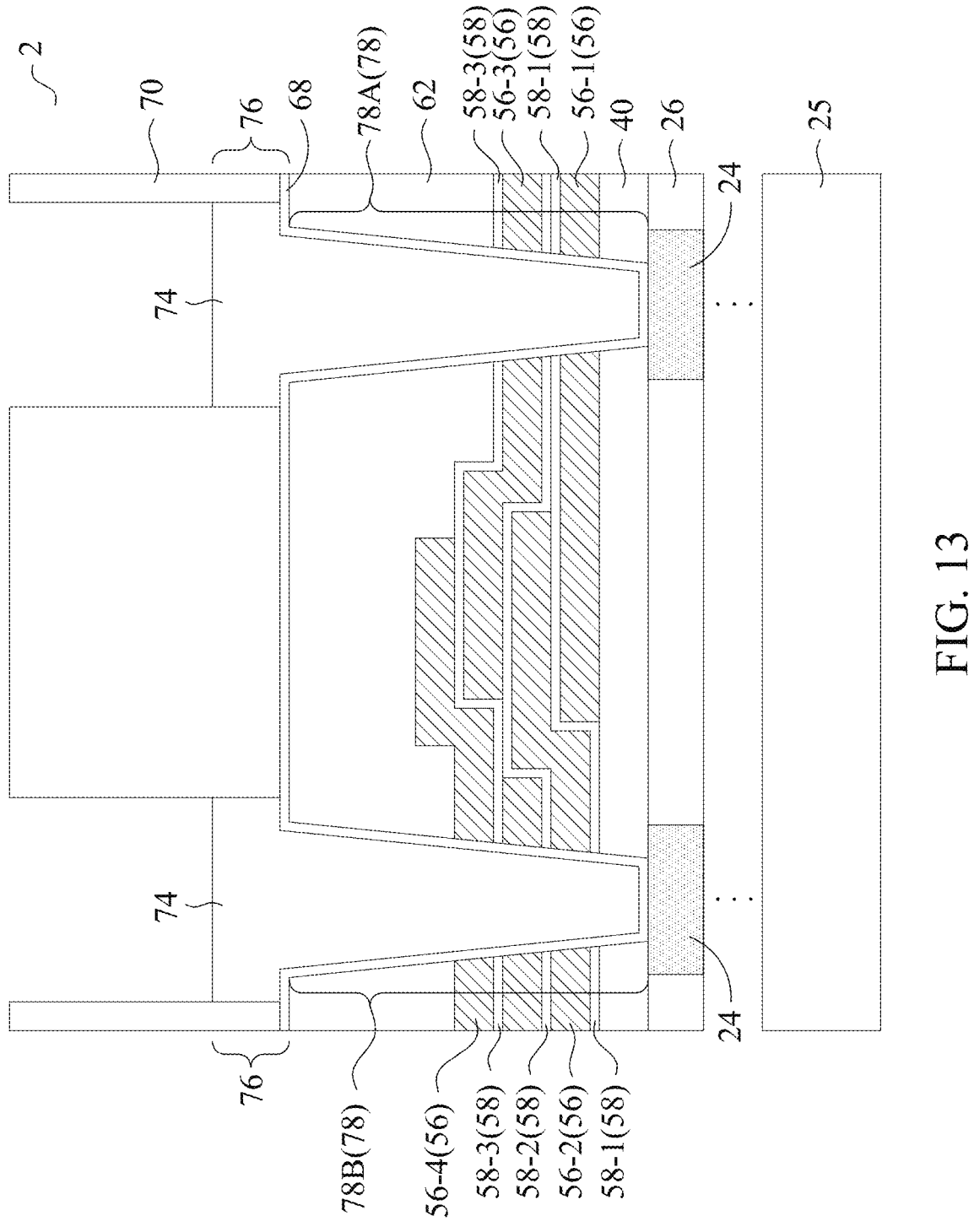

FIG. 13 illustrates the deposition of conductive material 74 on metal seed layer 68. Conductive material 74 is filled into contact openings 66 and openings 72. Contact plugs 78 and conductive lines 76 are thus formed. The respective process is illustrated as process 226 in the process flow 200 as shown in FIG. 22. In accordance with some embodiments, the formation of conductive material 74 includes a plating process, which may include an electrochemical plating process, an electroless plating process, or the like. Conductive material 74 may include copper, aluminum, nickel, tungsten, or the like, or alloys thereof.

Figure 14:
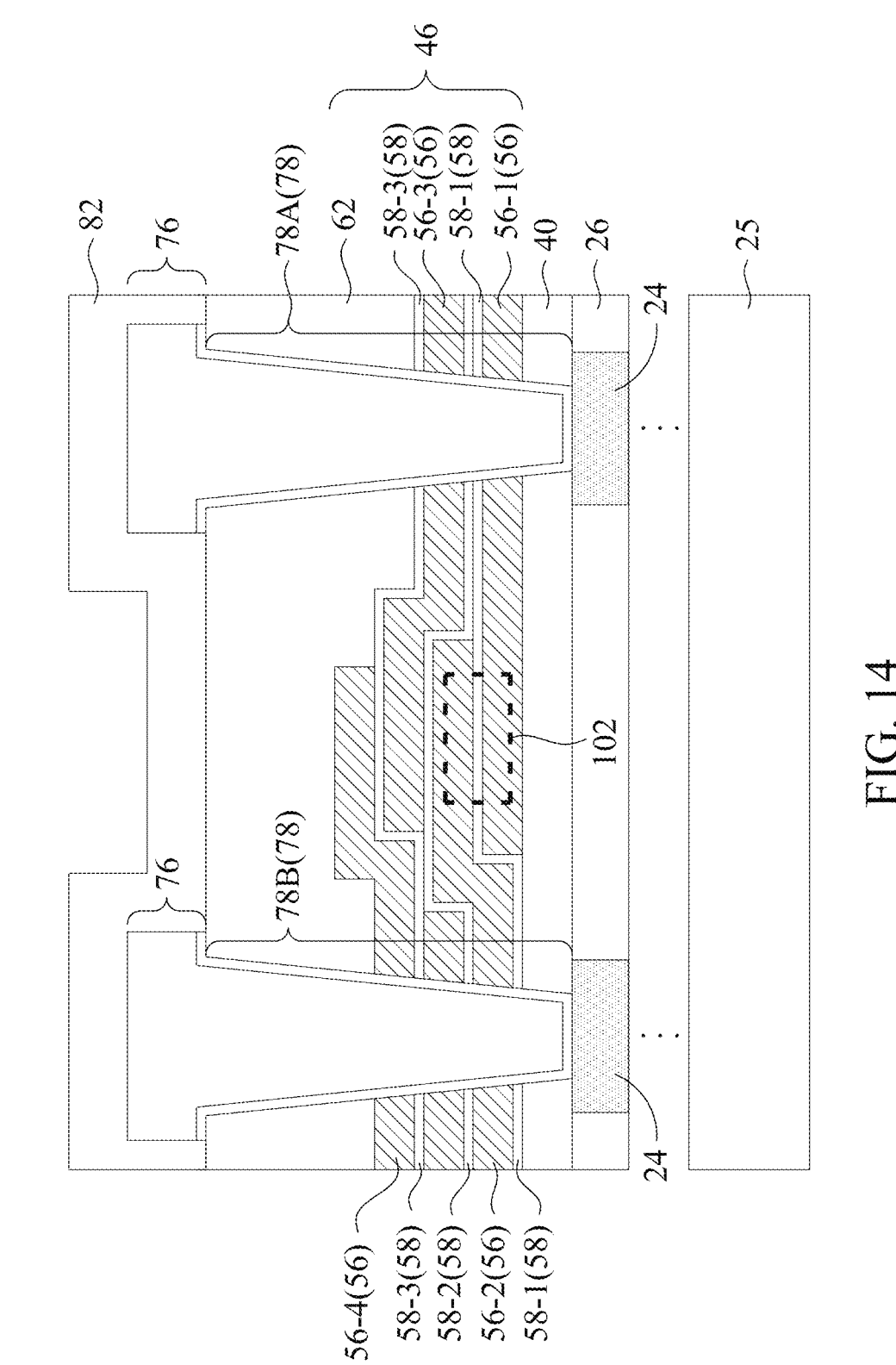

Next, the plating mask 70 as shown in FIG. 13 is removed. In a subsequent process, an etching process is performed to remove the portions of metal seed layer 68 that are not protected by the overlying contact plugs 78 and conductive lines 76. The resulting structure is also shown in FIG. 14. The remaining metal seed layer 68 becomes parts of contact plugs 78 and conductive lines 76. Contact plugs 78 include contact plugs 78A and 78B, which are connected to opposing capacitor electrodes of the capacitor 46.

Contact plug 78A is electrically connected to, and electrically shorts, capacitor electrodes 56-1 and 56-3. Contact plug 78B is electrically connected to, and electrically shorts, capacitor electrodes 56-2 and 56-4. Accordingly, capacitor 46 is formed, which include capacitor electrodes 56-1 and 56-3 collectively as a first capacitor electrode, and capacitor electrodes 56-2 and 56-4 collectively as a second capacitor electrode.

FIG. 14 further illustrates the formation of dielectric layer 82. The respective process is illustrated as process 228 in the process flow 200 as shown in FIG. 22. In accordance with some embodiments, dielectric layer 82 is a passivation layer, which may be formed of or comprises silicon nitride, silicon oxide, silicon oxynitride, silicon oxycarbide, or the like, or multi-layers thereof. In accordance with alternative embodiments, dielectric layer 82 may be formed of a low-k dielectric material when the resulting capacitor is one of capacitors 46A or 46B (FIG. 1). In accordance with yet alternative embodiments, dielectric layer 82 may be polymer layer 36 or 42 in the embodiments shown in FIG. 1.

FIGS. 15-20 illustrate the magnified views of intermediate stages in the formation of a lower capacitor electrode, a capacitor insulator, and an upper capacitor electrode in accordance with some embodiments. The corresponding processes are shown in the process flow 300 as in FIG. 23. The magnified portion may be the portion 102 in FIG. 14. Some processes as shown in the process flow 300 in FIG. 23 are collectively represented by process 206 in the process flow 200 in FIG. 22.

Referring to FIG. 15, capacitor electrode 56-1 is formed. The respective process is illustrated as process 302 in the process flow 300 as shown in FIG. 23. Process 302 also corresponds to processes 202 and 204 in the process 200 as shown in FIG. 22. In accordance with some embodiments as aforementioned, capacitor electrode 56-1 comprises TiN. Accordingly, the subsequent discussion uses TiN as an example, while capacitor electrode 56-1 may be formed of or comprise other conductive materials such as TaN. The deposition of capacitor electrode 56-1 may include ALD, PECVD, or the like. The precursors may include a titanium-containing precursor such as $Ti(N(CH_3)_2)_4$ (TDMAT), $TiCl_4$, or the like. The precursors further include a nitrogen-containing precursor such as $NH_3$, $N_2$, or the like. Other process gases such as $H_2$ may also be added.

Capacitor electrode 56-1 is deposited in a vacuum chamber, and is deposited as a blanket layer. The respective structure is also shown in FIG. 3. Next, capacitor electrode 56-1 is patterned, and the resulting structure is also shown in FIG. 4. FIG. 15 illustrates a portion of the patterned capacitor electrode 56-1. In order to perform the patterning process, wafer 2 may be exposed to air. Accordingly, a top surface portion of capacitor electrode 56-1 may be oxidized (through natural oxidation), and titanium oxide layer 104 is formed. Titanium oxide layer 104 is doped with nitrogen, and may be alternatively referred to as nitrogen-doped titanium oxide layer 104, titanium oxide layer 104, or TiON layer 104.

Referring to FIG. 16, a treatment process 106 is performed. The respective process is illustrated as process 304 in the process flow 300 as shown in FIG. 23. In accordance with some embodiments, the process gas used for treatment process 106 comprises nitrogen ($N_2$). The treatment process 106 may be performed through $N_2$ plasma. Alternatively, the first process gas may include argon, or the mixture of $N_2$ and argon. In accordance with some embodiments, the treatment is performed with an $N_2$ flow rate in a range between about 5,000 sccm and 18,000 sccm. The treatment time may be in the range between about 10 seconds and about 60 seconds.

In accordance with some embodiments, as shown in FIG. 17, a deposition process is performed to form high-k dielectric layer 108. The respective process is illustrated as process 306 in the process flow 300 as shown in FIG. 23. In accordance with some embodiments, high-k dielectric layer 108 is formed of or comprise titanium oxide (such as $TiO_2$), titanium oxynitride, hafnium oxide, zirconium oxide, zinc oxide, aluminum oxide, or the like. The thickness of high-k dielectric layer 108 may be in the range between about 0.5 nm and about 3 nm in accordance with some embodiments.

In accordance with alternative embodiments, the process for forming high-k dielectric layer 108 is skipped, and hence the subsequently formed major insulator layer 112 (FIG. 18) may physically contact the underlying titanium oxide layer 104. Accordingly, high-k dielectric layer 108 is illustrated as being dashed to indicate that it may or may not be formed. Throughout the description, high-k dielectric layer 108 and titanium oxide layer 104 are collectively referred to as dielectric layer 110.

In accordance with some embodiments, high-k dielectric layer 108 is deposited after the vacuum break for patterning capacitor electrode 56-1. Accordingly, high-k dielectric layer 108 may be deposited on the patterned capacitor electrode 56-1 and overlying the corresponding titanium oxide layer 104, and may be in the same deposition chamber for depositing major insulator layer 112 (FIG. 18). The respective high-k dielectric layer 108 includes a top portion over, and a sidewall portion on the sidewall 56-SW (FIG. 4) of, the patterned capacitor electrode 56-1.

In accordance with alternative embodiments, high-k dielectric layer 108 may be formed in the same vacuum chamber as the deposition of capacitor 56-1. Accordingly, titanium oxide layer 104 may not be formed, and high-k dielectric layer 108 is over and contacting capacitor electrode 56-1. high-k dielectric layer 108 may also be formed through a deposition process (using, for example, ALD, CVD, or the like) or through the oxidation of a surface layer of capacitor electrode 56-1. In accordance with these embodiments, high-k dielectric layer 108 is patterned using the same etching mask 60 (FIG. 3) for patterning capacitor electrode 56-1. The respective high-k dielectric layer 108 thus does not extend on the sidewall 56-SW (FIG. 4) of the patterned capacitor electrode 56-1.

High-k dielectric layer 108 may have a dielectric constant (k value) higher than the k value of the subsequently formed major insulator layer 112, so that high-k dielectric layer 108 may help to reduce the electrical field in major insulator layer 112, and to improve the Time-Dependent Dielectric Breakdown (TDDB) performance of major insulator layer 112. For example, assuming the k value of the subsequently deposited major insulator layer 112 (FIG. 20) is $K_{112}$, and the k value of high-k dielectric layer 108 is $K_{108}$, the difference in dielectric constant values ($K_{108}$-$K_{112}$) may be higher than about 5, higher than about 10, or higher. With the higher k value than major insulator layer 112, the addition of high-k dielectric layer 108, although causes the thickness of the resulting capacitor insulator to increase, will not cause the substantial reduction in the capacitance of the resulting capacitor 46.

Process conditions and deposition methods are selected so that high-k dielectric layer 108 is a dense layer having a high k value. For example, typical titanium oxide layers may have a k value ranging between about 10 and about 100, depending on their formation methods and properties. In accordance with some embodiments, high-k dielectric layer 108 may be deposited using ALD, CVD, MOCVD, PVD, or the like. The process conditions are adjusted to achieve a high k value. For example, deposition rate may be reduced to achieve a high k value, which may be greater than about 25, higher than about 30, higher than about 50, or higher in accordance with some embodiments.

Next, referring to FIG. 18, dielectric layer 112 is deposited. The respective process is illustrated as process 308 in the process flow 300 as shown in FIG. 23. Dielectric layer 112 acts as a major part of the capacitor insulator of the resulting capacitor, and is alternatively referred to as major insulator layer 112 hereinafter. In accordance with some embodiments, major insulator layer 112 is a high-k dielectric layer having a high dielectric constant value (k value), which may be, for example, higher than about 4.0, higher than about 7.0, or higher. In accordance with some embodiments, major insulator layer 112 includes hafnium oxide ($HfO_2$), zirconium oxide ($ZrO_2$), hafnium zirconium oxide (HfZrO), or the like. In accordance with some embodiments, major insulator layer 112 may include a plurality of hafnium oxide layers and a plurality of zirconium oxide layers deposited alternatingly. The resulting major insulator layer 112, with hafnium oxide and zirconium oxide being inter-diffused, is referred to as a HfZrO layer.

In accordance with some embodiments, the zirconium oxide layers and the hafnium oxide layers are deposited using ALD, Plasma-Enhanced Atomic Layer Deposition (PEALD), or the like. In accordance with some embodiments, the precursors for depositing zirconium oxide may comprise $ZrCl_4$ and water steam ($H_2O$). The precursors for depositing the hafnium oxide layers may include $HfCl_4$ and water steam ($H_2O$). The thickness of major insulator layer 112 may be in the range between about 40 Å and about 90 Å.

Figure 19:
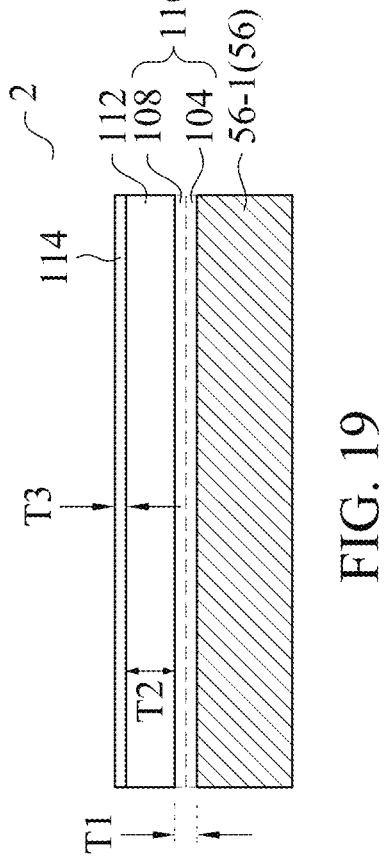

FIG. 19 illustrates the deposition of dielectric capping layer 114 in accordance with some embodiments. The respective process is illustrated as process 310 in the process flow 300 as shown in FIG. 23. Dielectric capping layer 114 is formed through a deposition process, which may be an ALD process, a CVD process, or the like. In accordance with some embodiments, dielectric capping layer 114 is formed of or comprise titanium oxide (such as $TiO_2$), titanium oxynitride, hafnium oxide, zirconium oxide, zinc oxide, aluminum oxide, or the like. The deposition of dielectric layers 108, 112 and 114 may be performed in-situ in a same process chamber without vacuum break in between, or may be performed ex-situ with vacuum break in between.

In accordance with some embodiments, dielectric capping layer 114 is formed of a same dielectric material, and has a same dielectric constant as that of high-k dielectric layer 108, so that the forward and reverse performance of the resulting capacitor 46 are close to each other, as will be discussed in subsequent paragraphs. Dielectric capping layer 114 may also be formed of the same dielectric material with similar (but different) k values as that of high-k dielectric layers 108 and 114. For example, the difference between the k value of dielectric capping layer 114 and the k values of either of high-k dielectric layers 108 and 104 may be smaller than about 5.

The thickness of dielectric capping layer 114 may be selected, so that the thickness of dielectric capping layer 114 is equal to or close to the thickness of dielectric layer 110, which includes at least one or both of nitrogen-doped titanium oxide layer 104 and high-k dielectric layer 108. The thicknesses of dielectric capping layer 114 and dielectric layer 110 may also have thickness substantially equal to each other, for example, with a difference smaller than about 20 percent or 10 percent of the thickness of each of dielectric capping layer 114 and dielectric layer 110. Dielectric capping layer 114 and dielectric layer 110 are also thinner than major insulator layer 112. In accordance with some embodiments, the thickness T3 of dielectric capping layer 114 may be in the range between about 0.5 nm and about 3 nm. The ratios T1/T2 and T3/T2 may be smaller than about 0.1 in accordance with some embodiments, wherein thicknesses T1 and T2 are the thickness values of dielectric layers 110 and 112, respectively.

Process conditions and deposition methods are selected to that dielectric capping layer 114 is formed as a dense layer having a high k value. In accordance with some embodiments, dielectric capping layer 114 may be deposited using ALD, CVD, MOCVD, PVD, or the like. The process conditions for depositing dielectric capping layer 114 are adjusted to achieve a high k value. For example, the deposition rate of dielectric capping layer 114 may be reduced so that dielectric capping layer 114 has a high k value, which may be greater than about 25, higher than about 30, higher than about 50, or higher in accordance with some embodiments.

Figure 20:
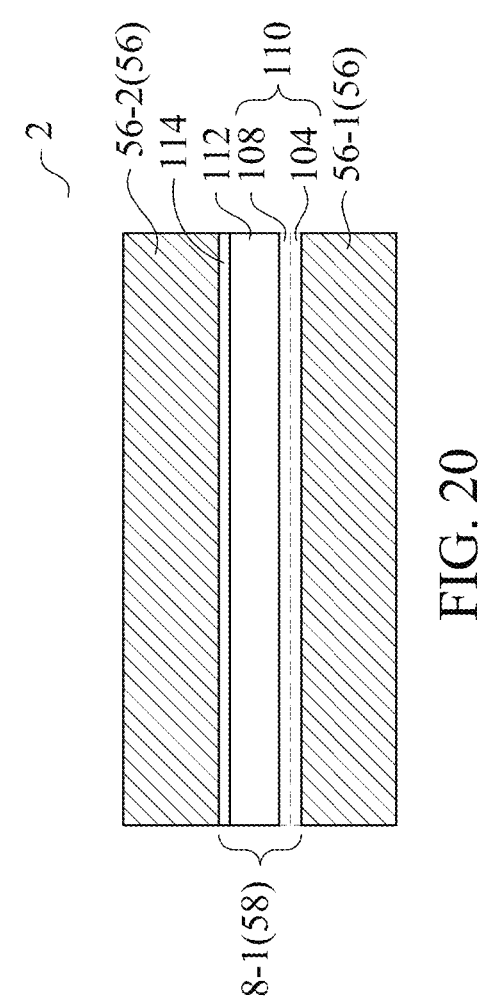

FIG. 20 illustrates the formation of capacitor electrode 56-2, and the corresponding process is also illustrated in FIGS. 6 and 7. The respective process is illustrated as process 312 in the process flow 300 as shown in FIG. 23, and as process 210 in the process flow 200 as shown in FIG. 22. As shown in FIG. 20, nitrogen-doped titanium oxide layer 110, major insulator layer 112, and dielectric capping layer 114 are collectively referred to as capacitor insulator 58-1, which is also shown in FIG. 6. In subsequent processes, more capacitor electrodes 56 and capacitor insulators 58 may be (or may not be) formed (as shown in FIGS. 8-14) to continue the formation of capacitor 46. The formation of the overlying capacitor electrodes 56 and capacitor insulators 58 may be essentially the same as the formation of capacitor electrode 56-1 and capacitor insulator 58-1, respectively.

Figure 21:
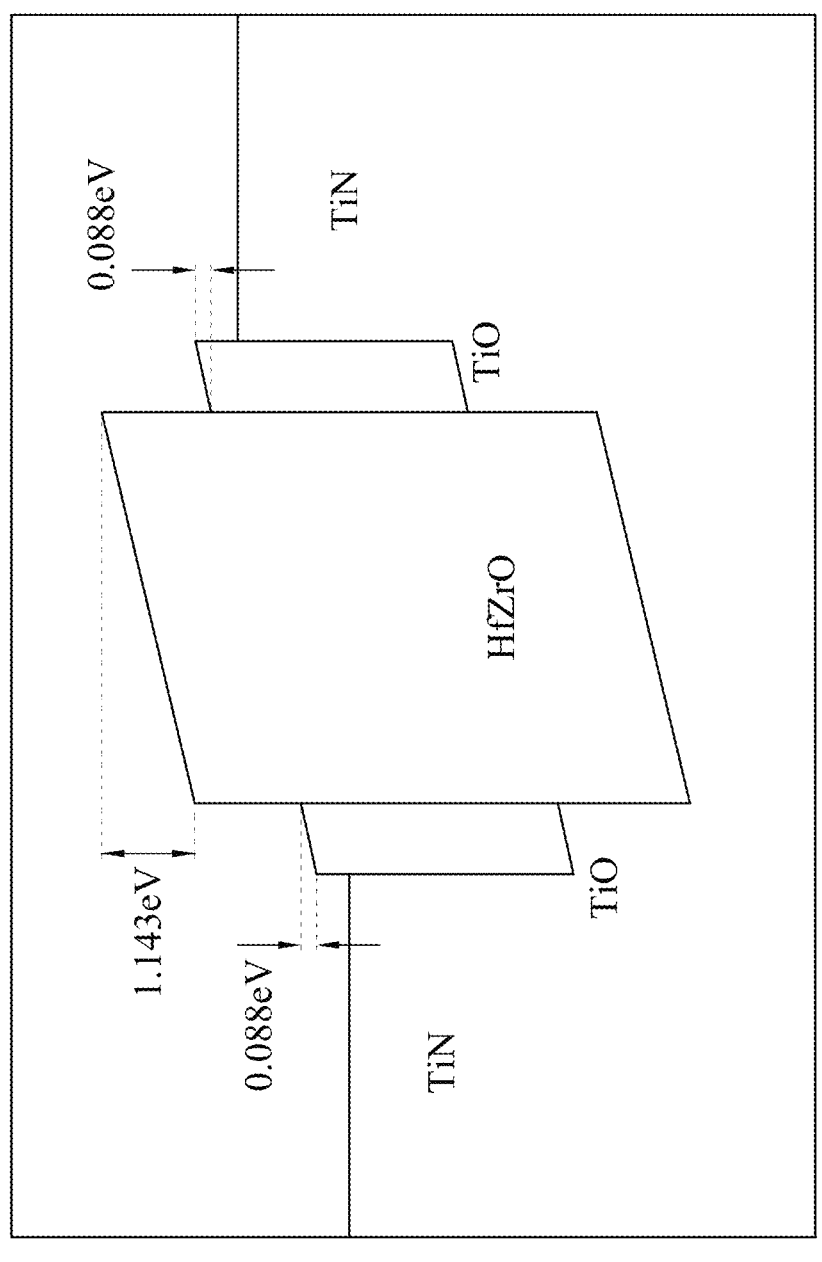
FIG. 21 illustrates a band diagram showing the voltage distribution in various layers in a capacitor insulator in accordance with some embodiments.

FIG. 21 illustrates a schematic band diagram illustrating the simulated energy bands of a first sample according to the embodiments of the present disclosure. The first sample includes a first titanium oxide layer with a thickness of 10 Å, a HfZrO layer with a thickness of 55 Å, and a second titanium oxide layer with a thickness of 10 Å. When a 2.2V voltage is applied on the first sample, the band heights of the first titanium oxide layer, the HfZrO layer, and the second titanium oxide layer are 0.088 eV, 1.143 eV, and 0.088 eV, respectively. The band heights reflect the voltages and the electrical fields applied on these layers.

As a comparison, a second sample is simulated. The second sample is similar to the first sample, except that the second titanium oxide layer is not formed. The band heights in the first titanium oxide layer and the HfZrO layer are increased to about 0.095 eV and 1.225 eV, respectively. The corresponding electrical field in the HfZrO layer may reach as high as about 2.23 MV/cm. Such a high electrical field will stress the capacitor insulator, and may lead to dielectric hard breakdown. Accordingly, in the embodiments of the present application, the second titanium oxide layer is formed to share the voltage drop and hence reduce the electrical field in the capacitor insulator.

The adding of dielectric capping layer 114 also results in the improvement in the breakdown voltages and TDDB performance. Experiment results have revealed that the second sample (which doesn't include dielectric capping layer 114) has forward breakdown voltage and reverse breakdown voltage being about 2.96 volts and about 2.88 volts, respectively. In the first sample, however, the forward breakdown voltage and reverse breakdown voltage are advantageously increased to be about 3.01 volts and about 3.10 volts, respectively.

Furthermore, with the formation of dielectric capping layer 114 on the opposite side of major insulator layer 112 than dielectric layer 110, the capacitor insulator 58-1 has a more symmetric structure. This results the significant improvement in TDDB lifetime. The forward TDDB lifetime and the reverse TDDB lifetime of the second sample are 0.02 years (which is too low) and over 1,000 years, respectively. The first sample, on the other hand, have a forward TDDB lifetime and a reverse TDDB lifetime being 2.64 years and over 1,000 years, respectively. The forward TDDB lifetime was thus improved by over 100 times. While the TDDB lifetime is improved, the leakage and the capacitance of the first sample are similar to that of the second sample.

The embodiments of the present disclosure have some advantageous features. By adding a dielectric capping layer into a capacitor insulator of a capacitor, the TDDB lifetime of the capacitor is improved, and the breakdown voltages of the capacitor is also improved. The dielectric capping layer has a higher k value than the k value of the respective underlying major insulator layer. Accordingly, the capacitance is not reduced substantially.

In accordance with some embodiments of the present disclosure, a method comprises forming a first electrode; depositing a dielectric layer over the first electrode, wherein the dielectric layer has a first dielectric constant and a first thickness; depositing a dielectric capping layer over the dielectric layer, wherein the dielectric capping layer has a second dielectric constant higher than the first dielectric constant, and the dielectric capping layer has a second thickness smaller than the first thickness; forming a second electrode over the dielectric capping layer; forming a first contact plug electrically connecting to the first electrode; and forming a second contact plug electrically connecting to the second electrode. In an embodiment, the depositing the dielectric capping layer comprises depositing a first titanium oxide layer.

In an embodiment, a second titanium oxide layer is formed over the first electrode and under the dielectric layer. In an embodiment, the second titanium oxide layer is formed through processes that comprises a deposition process. In an embodiment, the first titanium oxide layer and the second titanium oxide layer have a same thickness. In an embodiment, the dielectric layer is deposited over and contacting a native oxide layer of the first electrode. In an embodiment, the native oxide layer comprises a first titanium oxide layer.

In an embodiment, the method further comprises depositing a second titanium oxide layer over the first titanium oxide layer, wherein the second titanium oxide layer is under the dielectric layer. In an embodiment, the first electrode comprises titanium nitride, and wherein the first titanium oxide layer comprises nitrogen doped therein. In an embodiment, the method further comprises performing a plasma treatment on the first electrode using a process gas comprising nitrogen ($N_2$).

In accordance with some embodiments of the present disclosure, a structure comprises a capacitor comprising a first electrode; a major capacitor insulator over the first electrode, wherein the major capacitor insulator has a first dielectric constant and a first thickness; a dielectric capping layer over the major capacitor insulator, wherein the dielectric capping layer has a second dielectric constant higher than the first dielectric constant, and the dielectric capping layer further has a second thickness smaller than the first thickness; and a second electrode over the dielectric capping layer. In an embodiment, the major capacitor insulator comprises hafnium zirconium oxide, and wherein the dielectric capping layer comprises titanium oxide.

In an embodiment, the structure further comprises an additional dielectric layer underlying and contacting the major capacitor insulator, wherein the additional dielectric layer comprises titanium oxide. In an embodiment, the additional dielectric layer further comprises nitrogen doped in the titanium oxide. In an embodiment, the dielectric capping layer and the additional dielectric layer have a same thickness. In an embodiment, the additional dielectric layer comprises a sidewall portion extending on a sidewall of the first electrode. In an embodiment, the additional dielectric layer is free from a sidewall portion extending on a sidewall of the first electrode.

In accordance with some embodiments of the present disclosure, a structure comprises a first electrode comprising titanium nitride; a capacitor insulator comprising a first titanium oxide layer over the first electrode; a dielectric layer over the first titanium oxide layer; and a second titanium oxide layer over the dielectric layer; a second electrode over the capacitor insulator, wherein the second electrode comprises titanium nitride; a first contact plug electrically connecting to the first electrode; and a second contact plug electrically connecting to the second electrode. In an embodiment, the dielectric layer is thicker than both of the first titanium oxide layer and the second titanium oxide layer. In an embodiment, dielectric constants of the first titanium oxide layer and the second titanium oxide layer are higher than an additional dielectric constant of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first electrode;
depositing a dielectric layer over the first electrode, wherein the dielectric layer has a first dielectric constant and a first thickness, and wherein the dielectric layer is deposited over and contacting a native oxide layer of the first electrode;
depositing a dielectric capping layer over the dielectric layer, wherein the dielectric capping layer has a second dielectric constant higher than the first dielectric constant, and the dielectric capping layer has a second thickness smaller than the first thickness;
forming a second electrode over the dielectric capping layer;
forming a first contact plug electrically connecting to the first electrode; and
forming a second contact plug electrically connecting to the second electrode.

2. The method of claim 1, wherein the depositing the dielectric capping layer comprises depositing a first titanium oxide layer.

3. The method of claim 2, wherein a second titanium oxide layer is formed over the first electrode and under the dielectric layer.

4. The method of claim 3, wherein the second titanium oxide layer is formed through processes that comprise a deposition process.

5. The method of claim 3, wherein the first titanium oxide layer and the second titanium oxide layer have a same thickness.

6. The method of claim 1, wherein the native oxide layer comprises a first titanium oxide layer.

7. The method of claim 6 further comprising depositing a second titanium oxide layer over the first titanium oxide layer, wherein the second titanium oxide layer is under the dielectric layer.

8. The method of claim 6, wherein the first electrode comprises titanium nitride, and wherein the first titanium oxide layer comprises nitrogen doped therein.

9. The method of claim 1 further comprising:
performing a plasma treatment on the first electrode using a process gas comprising nitrogen ($N_2$).

10. The method of claim 1, wherein the first contact plug and the second contact plug are in a polymer layer.

11. A structure comprising:
a capacitor comprising:
a first electrode;
a major capacitor insulator over the first electrode, wherein the major capacitor insulator comprises hafnium zirconium oxide, wherein the major capacitor insulator has a first dielectric constant and a first thickness;
a dielectric capping layer over the major capacitor insulator, wherein the dielectric capping layer comprises titanium oxide, and wherein the dielectric capping layer has a second dielectric constant higher than the first dielectric constant, and the dielectric capping layer further has a second thickness smaller than the first thickness; and
a second electrode over the dielectric capping layer.

12. The structure of claim 11 further comprising an additional dielectric layer underlying and contacting the major capacitor insulator, wherein the additional dielectric layer comprises titanium oxide.

13. The structure of claim 12, wherein the additional dielectric layer further comprises nitrogen doped in the titanium oxide.

14. The structure of claim 12, wherein the dielectric capping layer and the additional dielectric layer have a same thickness.

15. The structure of claim 12, wherein the additional dielectric layer comprises a sidewall portion extending on a sidewall of the first electrode.

16. The structure of claim 12, wherein the additional dielectric layer is free from a sidewall portion extending on a sidewall of the first electrode.

17. The structure of claim 11 further comprising a polymer layer, wherein the capacitor is formed in the polymer layer.

18. A structure comprising:
a first electrode comprising titanium nitride;
a capacitor insulator comprising:
a titanium oxynitride layer over the first electrode;
a dielectric layer over the titanium oxynitride layer; and
a titanium oxide layer over the dielectric layer;

a second electrode over the capacitor insulator, wherein the second electrode comprises titanium nitride;

a first contact plug electrically connecting to the first electrode; and a second contact plug electrically connecting to the second electrode.

19. The structure of claim 18, wherein the dielectric layer is thicker than both of the titanium oxynitride layer and the titanium oxide layer.

20. The structure of claim 18, wherein dielectric constants of the titanium oxynitride layer and the titanium oxide layer are higher than an additional dielectric constant of the dielectric layer.

\* \* \* \* \*